US007829922B2

United States Patent
McKee (10) Patent No.: US 7,829,922 B2
(45) Date of Patent: *Nov. 9, 2010

(54) PIXEL WITH TRANSFER GATE WITH NO ISOLATION EDGE

(75) Inventor: Jeffrey A. McKee, Meridian, ID (US)

(73) Assignee: Aptina Imaging Corporation, Grand Cayman (KY)

( * ) Notice: Subject to any disclaimer, the term of this patent is extended or adjusted under 35 U.S.C. 154(b) by 0 days.

This patent is subject to a terminal disclaimer.

(21) Appl. No.: 12/249,723

(22) Filed: Oct. 10, 2008

(65) Prior Publication Data

US 2009/0090945 A1    Apr. 9, 2009

Related U.S. Application Data

(63) Continuation of application No. 11/178,798, filed on Jul. 12, 2005, now Pat. No. 7,449,736.

(51) Int. Cl.
*H01L 31/062* (2006.01)
*H01L 31/113* (2006.01)

(52) U.S. Cl. .............................. 257/292; 257/E27.131; 438/60

(58) Field of Classification Search ........................ None
See application file for complete search history.

(56) References Cited

U.S. PATENT DOCUMENTS

| | | | |
|---|---|---|---|
| 6,140,630 A | 10/2000 | Rhodes | |
| 6,204,524 B1 | 3/2001 | Rhodes | |
| 6,310,366 B1 | 10/2001 | Rhodes | |
| 6,326,652 B1 | 12/2001 | Rhodes | |
| 6,333,205 B1 | 12/2001 | Rhodes | |
| 6,376,868 B1 | 4/2002 | Rhodes | |
| 7,145,122 B2 | 12/2006 | Nozaki et al. | |
| 7,358,108 B2 | 4/2008 | Han et al. | |
| 7,511,323 B2 * | 3/2009 | McKee | 257/294 |
| 2003/0127666 A1 | 7/2003 | Lee | |
| 2005/0088556 A1 | 4/2005 | Han | |
| 2005/0093036 A1 | 5/2005 | Han | |
| 2005/0133825 A1 | 6/2005 | Rhodes et al. | |
| 2005/0156213 A1 | 7/2005 | Han et al. | |
| 2006/0011919 A1 | 1/2006 | Mouli | |
| 2007/0012970 A1 | 1/2007 | Mouli | |
| 2007/0269944 A1 | 11/2007 | Lee | |
| 2009/0008686 A1 * | 1/2009 | Maeda et al. | 257/292 |

FOREIGN PATENT DOCUMENTS

| | | |
|---|---|---|
| EP | 0 862 219 A2 | 9/1998 |
| EP | 0 898 312 A2 | 2/1999 |
| KR | 10-2005-0070938 | 7/2005 |
| KR | 2005/0070938 A | 7/2005 |

OTHER PUBLICATIONS

EP Office Action dated Jun. 13, 2008 with Written Opinion.
Korean Office Action, and its English translation, dated Nov. 28, 2009 issued in Korean Application No. 10-2008-7002939.

* cited by examiner

*Primary Examiner*—Benjamin P Sandvik
(74) *Attorney, Agent, or Firm*—Dickstein Shapiro LLP (57) ABSTRACT

A pixel and imager device, and method of forming the same, where the pixel has a transfer transistor gate associated with a photoconversion device and is isolated in a substrate by shallow trench isolation. The transfer transistor gate does not overlap the shallow trench isolation region.

20 Claims, 12 Drawing Sheets

PIXEL WITH TRANSFER GATE WITH NO ISOLATION EDGE

This application is a continuation application of U.S. patent application Ser. No. 11/178,798, filed Jul. 12, 2005, now U.S. Pat. No. 7,449,736 the complete disclosure of which is incorporated herein by reference.

BACKGROUND

1. Field of the Invention

The invention relates to imager technology. In particular, the invention relates to imager devices having a pixel with a transfer transistor gate configured to mitigate dark current generation.

2. Description of the Related Art

Exemplary CMOS imaging circuits, processing steps thereof, and detailed descriptions of the functions of various CMOS elements of an imaging circuit are described, for example, in U.S. Pat. No. 6,140,630, U.S. Pat. No. 6,376,868, U.S. Pat. No. 6,310,366, U.S. Pat. No. 6,326,652, U.S. Pat. No. 6,204,524, and U.S. Pat. No. 6,333,205, each assigned to Micron Technology, Inc. The disclosures of the forgoing patents are hereby incorporated by reference in their entirety.

Figure 1:
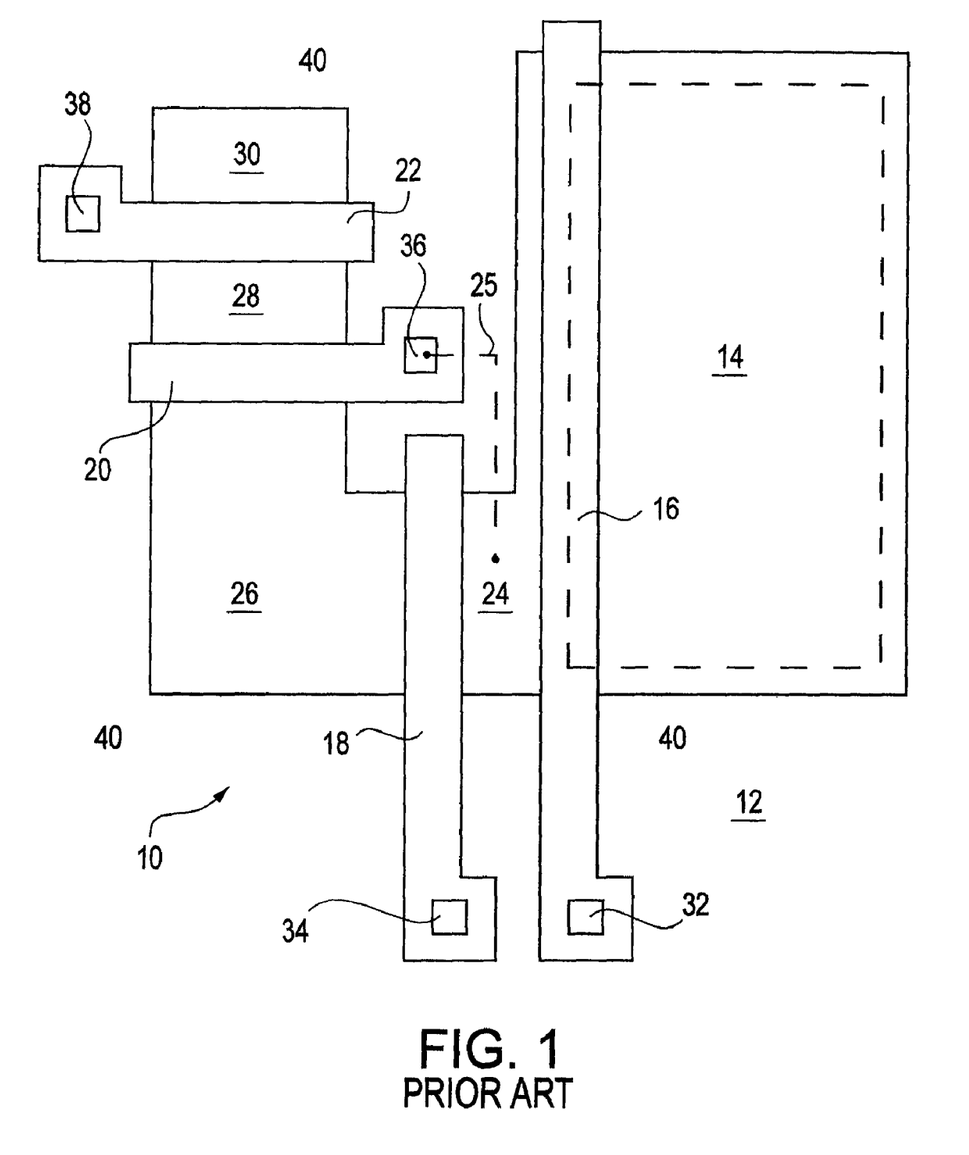
FIG. 1 is a top-down view of a conventional CMOS pixel cell.

FIG. 1 illustrates a top-down view of a conventional CMOS pixel 10 having a photodiode 14 in a substrate 12 as a photoconversion device. The pixel 10 includes a transfer transistor gate 16, which, with the photodiode 14 and a floating diffusion region 24, forms a transfer transistor. Also included is a reset transistor gate 18, which gates a reset voltage ($V_{aa}$) applied to an active area 26 to floating diffusion region 24 so that the floating diffusion region 24 resets. The photodiode 14 may also be reset when both the reset transistor gate 18 and transfer transistor gate 16 are turned on. Also included is a source follower transistor gate 20, which is electrically coupled 25 to the floating diffusion region 24 and which is part of a source follower transistor formed by active area 26, which is connected to voltage source ($V_{aa}$), and an active area 28 associated with a row select transistor gate 22. The row select transistor gate 22 is operated as part of a row select transistor, which connects active area 28 and active area 30, which is connected to the pixel output for reading the pixel.

As is shown in FIG. 1, in the conventional pixel 10, the transfer transistor gate 16 spans the photodiode 14. The pixel's 10 active regions, which include the photodiode 14, the floating diffusion region 24, and active areas 26, 28, and 30, are surrounded by a shallow trench isolation (STI) region 40. Where the transfer transistor gate 16 extends beyond the photodiode 14, it overlaps the edges of the STI region 40. This overlap can result in the production of dark current, which is undesirable in imager devices.

SUMMARY

The invention relates to an imager (image sensor) pixel having a photoconversion device and transistor structures, wherein a transfer transistor gate of the pixel is configured so as not to overlap the edge of proximate shallow trench isolation (STI) regions or other isolation features (e.g., LOCOS). An optional p-type implant in the substrate along the border region between the transfer transistor gate and the STI region can be used to limit charge transfer to underneath (as opposed to along the sides of) the transfer transistor gate.

These and other features of the invention will be better understood from the following detailed description, which is provided in connection with the accompanying drawings.

DETAILED DESCRIPTION

Although this invention will be described in terms of certain exemplary embodiments, other embodiments will be apparent to those of ordinary skill in the art and are within the scope of this invention. Accordingly, the scope of the invention is defined only by reference to the appended claims.

The term "substrate" or "wafer," used interchangeably in the following description, may include any supporting structure including, but not limited, to a semiconductor substrate. A semiconductor substrate should be understood to include silicon-on-insulator (SOI), silicon-on-sapphire (SOS), doped and undoped semiconductors, epitaxial layers of silicon supported by a base semiconductor foundation, and other semiconductor structures; however, materials other than semiconductors can be used as well so long as they are suitable to support an integrated circuit. When reference is made to a substrate or wafer in the following description, previous process steps may have been utilized to form regions or junctions in or over a base semiconductor or foundation.

The term "pixel" refers to a photo-element unit cell containing a photoconversion device and associated transistors for converting electromagnetic radiation to an electrical signal. The pixels discussed herein are illustrated and described as 4T (4 transistors) pixel circuits for the sake of example only. It should be understood that the invention is not limited to a four transistor (4T) pixel, but may be used with other pixel arrangements having fewer (e.g., 3T) or more (e.g., 5T) than four transistors. Although the invention is described herein with reference to the architecture and fabrication of one or a limited number of pixels, it should be understood that this is representative of a plurality of pixels as typically would be arranged in an imager array having pixels arranged, for example, in rows and columns. In addition, although the invention is described below with reference to a pixel for a CMOS imager, the invention has applicability to other solid state imaging devices having pixels (e.g., a CCD or other solid state imager). The following detailed description is, therefore, not to be taken in a limiting sense, and the scope of the present invention is defined only by the appended claims.

Figure 2:
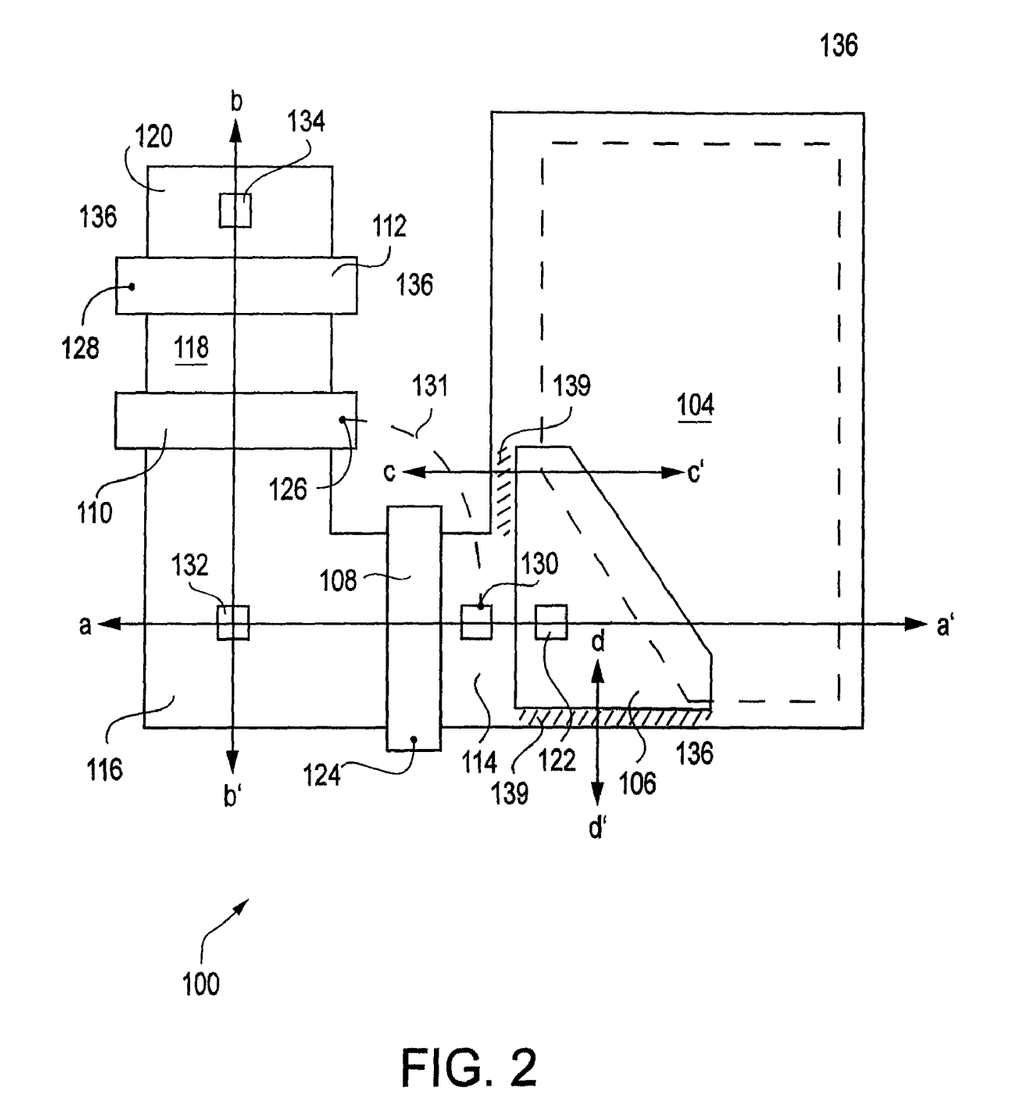
FIG. 2 shows a CMOS pixel cell in accordance with an embodiment of the invention.

The invention will now be explained with reference to the accompanying figures wherein like reference numbers are used consistently for like features throughout the drawings. FIG. 2 shows an exemplary CMOS pixel 100 in accordance with an embodiment of the invention. The pixel 100 is fabricated in and over a semiconductor substrate 102. The pixel 100 can be isolated from other like pixels of an array by shallow trench isolation region(s) (STI) 136 (or another similar isolation technique, such as LOCOS), which surrounds the active area of the pixel 100 as shown. The pixel 100 of this embodiment is a 4T pixel, meaning that the pixel's circuitry includes four transistors for operation; however, as indicated above, the invention is not limited to 4T pixels.

Still referring to FIG. 2, the pixel 100 has a photodiode 104 as a photoconversion device. The photodiode 104 is formed in the substrate 102 by forming layered doped regions of varying depths, as will be discussed below in further detail with reference to FIGS. 3-9. Other types of photoconversion devices may be used as well, e.g., a photogate. A transfer transistor is associated with the photodiode 104. The transfer transistor includes a transfer gate 106 configured to gate charge across a channel region between the photodiode 104 and a floating diffusion region 114. The transfer gate 106 is configured so that it does not overlap the edge(s) of the STI regions(s) 136 (or other isolation feature). This configuration mitigates dark current in the pixel 100. An n-type (minus) implant in the substrate (e.g., implant 138, FIG. 4) directs charge generated at the photodiode 104 to the transfer gate 106. If desired, an optional p-type implant 139 can be provided along the border region between the STI 136 edge and the transfer gate 106 to further limit charge transfer to the channel region 115 (FIG. 7) underneath the gate 106.

The floating diffusion region 114 is electrically connected (connection 131) to a gate 110 of a source follower transistor. The source follower transistor is electrically connected to a row select gate 112, configured to output a read signal from the pixel 100 at conductor 134. A reset transistor having a reset gate 108 electrically connected with a voltage source (e.g., $V_{aa}$) is provided for resetting the floating diffusion region 114 after readout.

Contacts 122, 124, 126, 128, 130, 132 and 134 to upper layer metallization layers are provided for these active regions, i.e., source/drain regions 116, 118, 120, floating diffusion region 114, and gate structures 106, 108, 110, 112, typically as conductive plugs, which may be tungsten, titanium, or other conductive materials. Contact 130 connects with source follower gate 110 though electrical connection 131. Contact 132 connects a voltage source ($V_{aa}$) to source/drain region 116. Contact 134 connects read circuitry with the output source/drain region 120 of the row select transistor.

The pixel 100 operates as a standard CMOS imager pixel. The photodiode 104 generates charge at a p-n junction (FIG. 8) when struck by light. The charge generated and accumulated at the photodiode 104 is gated to the floating diffusion region 114 by turning on the transfer gate 106. The charge at the floating diffusion region 114 is converted to a pixel output voltage signal by the source follower transistor, including gate 110 (connected to floating diffusion region 114 at contact 130), through source/drain region 118 and this output signal is gated by row select gate 112 to source/drain region 120 and is output at contact 134 to read circuitry (not shown). After the signal is read out of the pixel 100, the reset gate 108 and transfer gate 106 can be activated to connect a voltage source at contact 132 to the floating diffusion region 114 and photodiode 104 to reset the pixel 100.

FIGS. 3-9 show cross sections of a pixel 100 as shown in FIG. 2 at various stages of fabrication. The figures generally show sequential steps, which may be utilized to form a pixel 100; however, other or additional processing steps may be used also. Now referring to FIG. 3, a substrate region 102 is provided. The substrate 102 region is typically silicon, though other semiconductor substrates can be used. Preferably, substrate 102 is formed over another substrate region 101, which can have a different dopant concentration from the overlying region 102. In such an embodiment, substrate region 102 can be grown as an epi-layer over a supporting silicon substrate region 101.

Figure 3:
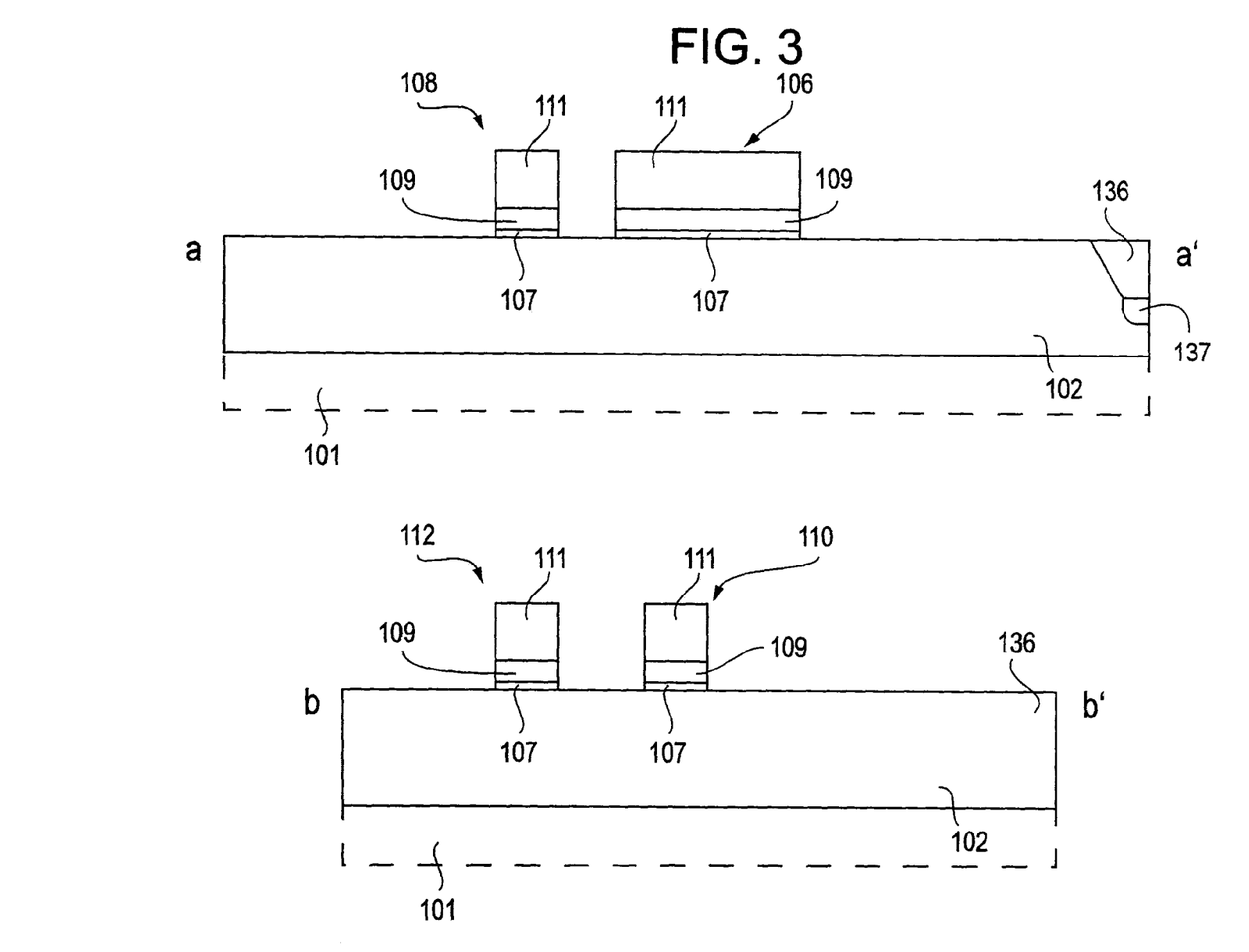
FIGS. 3-9 show stages of fabrication of an example of a CMOS pixel cell an accordance with the invention, as shown by FIG. 2, through lines a-a', b-b', c-c', and d-d' of FIG. 2.

Shallow trench isolation (STI) is performed to form STI regions 136, which are typically an oxide and serve to electrically isolate individual pixels, including pixel 100, from one other. STI processing is well known in the art and standard processing techniques may be used. A region 137 of the substrate 102 under the STI trench may be doped to improve electrical isolation.

Over the substrate, the transfer gate 106, reset gate 108, source follower gate 110, and row select gate 112 are formed. These gates may be fabricated by forming a gate oxide 107 over the substrate 102, a conductive layer 109 over the gate oxide 107, and an insulating layer 111 over the conductive layer 109. The gate oxide 107 is typically silicon dioxide, but may be other materials as well. The conductive layer 109 is typically doped polysilicon, but may be other conductive materials as well. The insulating layer 111 is typically a nitride or TEOS (tetraethyl orthosilicate oxide), but may be other insulating materials as well. These layers 107, 109, and 111, are patterned with a photoresist mask and etched to leave gate stacks as shown in FIG. 3. As discussed above, the transfer transistor gate 106 is formed so as not to overlap the STI region 136.

Figure 4:
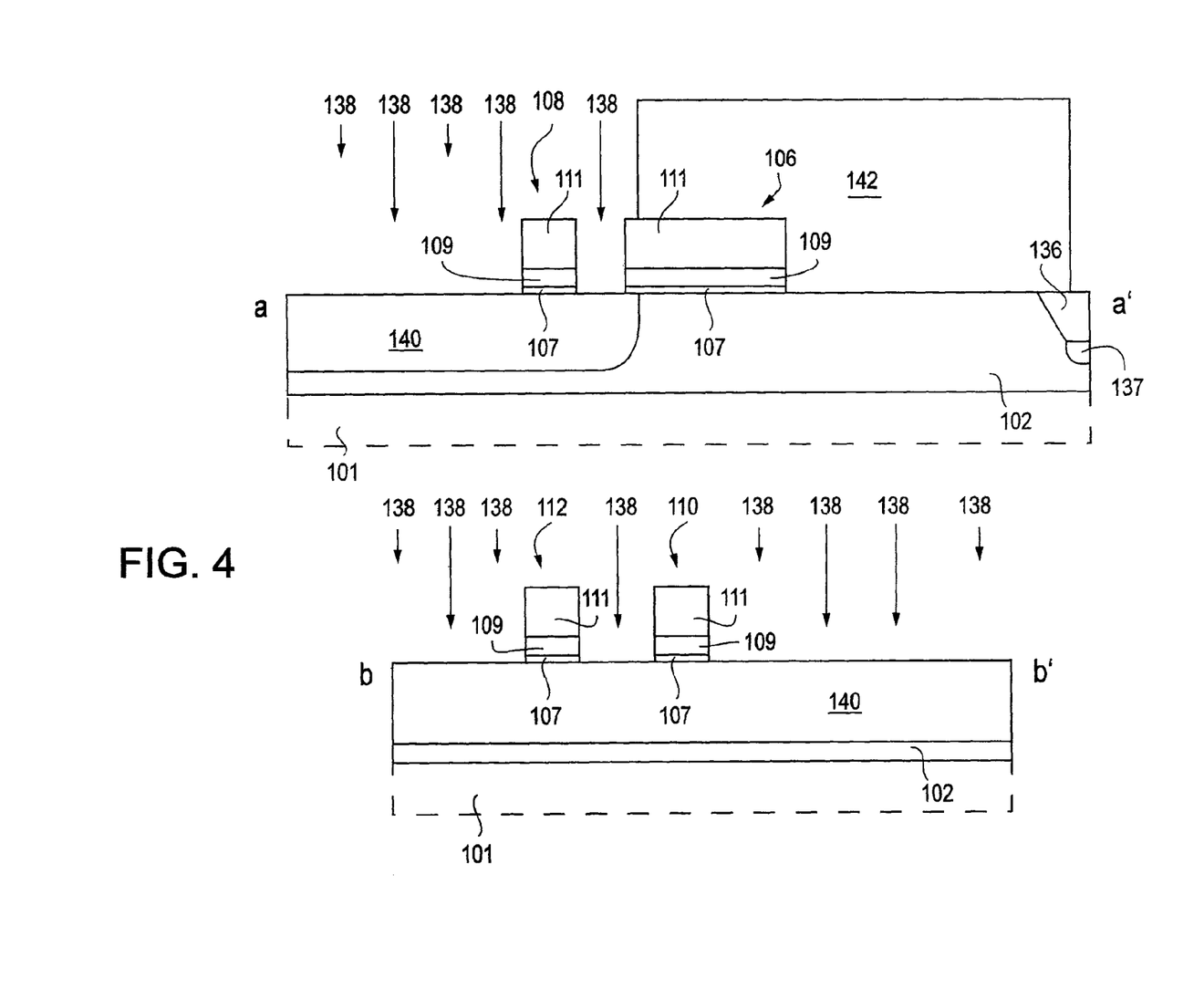

Now referring to FIG. 4, this figure shows the wafer cross-section shown in FIG. 3 at a subsequent stage of fabrication. A photoresist mask 142 is formed over the substrate 102 to protect the region that will become the photodiode 104 while exposing the substrate 102 surfaces proximate the transistor gates 106, 108, 110, and 112. A p-type dopant 138, e.g., boron, is implanted into the substrate 102 to form a p-well 140 therein.

Figure 5:
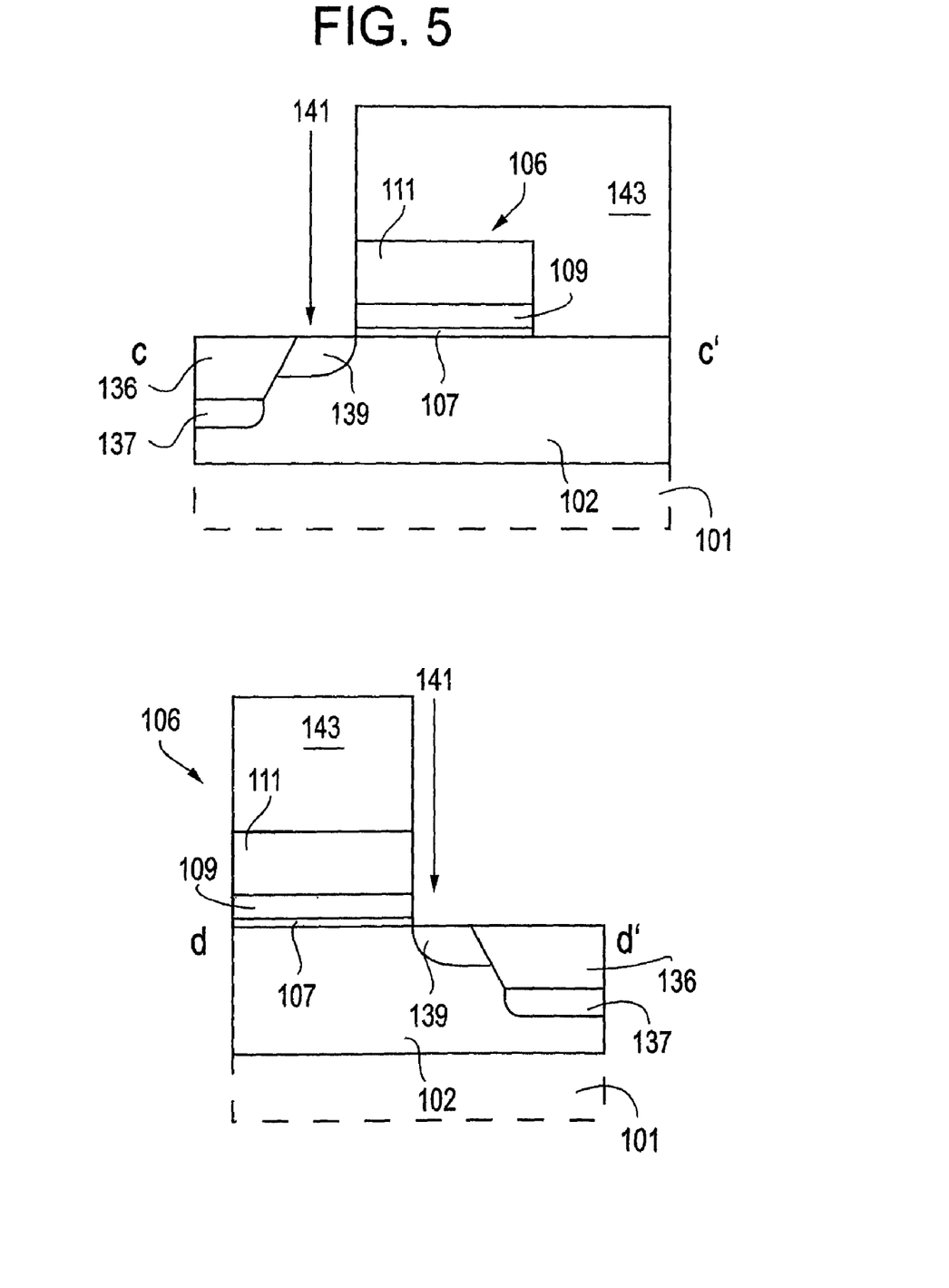

Now referring to FIG. 5, which shows a subsequent stage of processing with the wafer shown through cross-sections c-c' and d-d' of FIG. 2. After forming the p-well 140 (FIG. 4), the photoresist mask 142 is removed and photoresist mask 143 is applied, which exposes the substrate at least at the border region between the STI region 136 and the transfer transistor gate 106. P-type ions 141, e.g., boron, are implanted to form implant regions 139. This implant is optional, but can serve to further limit charge transfer to underneath (as opposed to along the sides of) the transfer transistor gate 106 in the completed device.

Now referring to FIG. 6, which again shows the wafer through cross-sections a-a' and b-b', at a subsequent stage of fabrication. After forming the p-well 140, or after forming implant regions 139 if desired, photoresist mask 140 (FIG. 4) or 143 (FIG. 5) is removed and another photoresist mask 144 is formed over the p-well 140 region of the substrate 102 to expose the surface of the substrate 102 where the photodiode 104 will be formed (FIG. 2). An n-type dopant 146, e.g., phosphorus, is implanted into the substrate 102 (directly there-into and at an angle thereto as shown) to form an n-type doped region 148. This n-type region 148 will form a charge accumulation portion of the photodiode 102 (FIG. 2).

Figure 6:
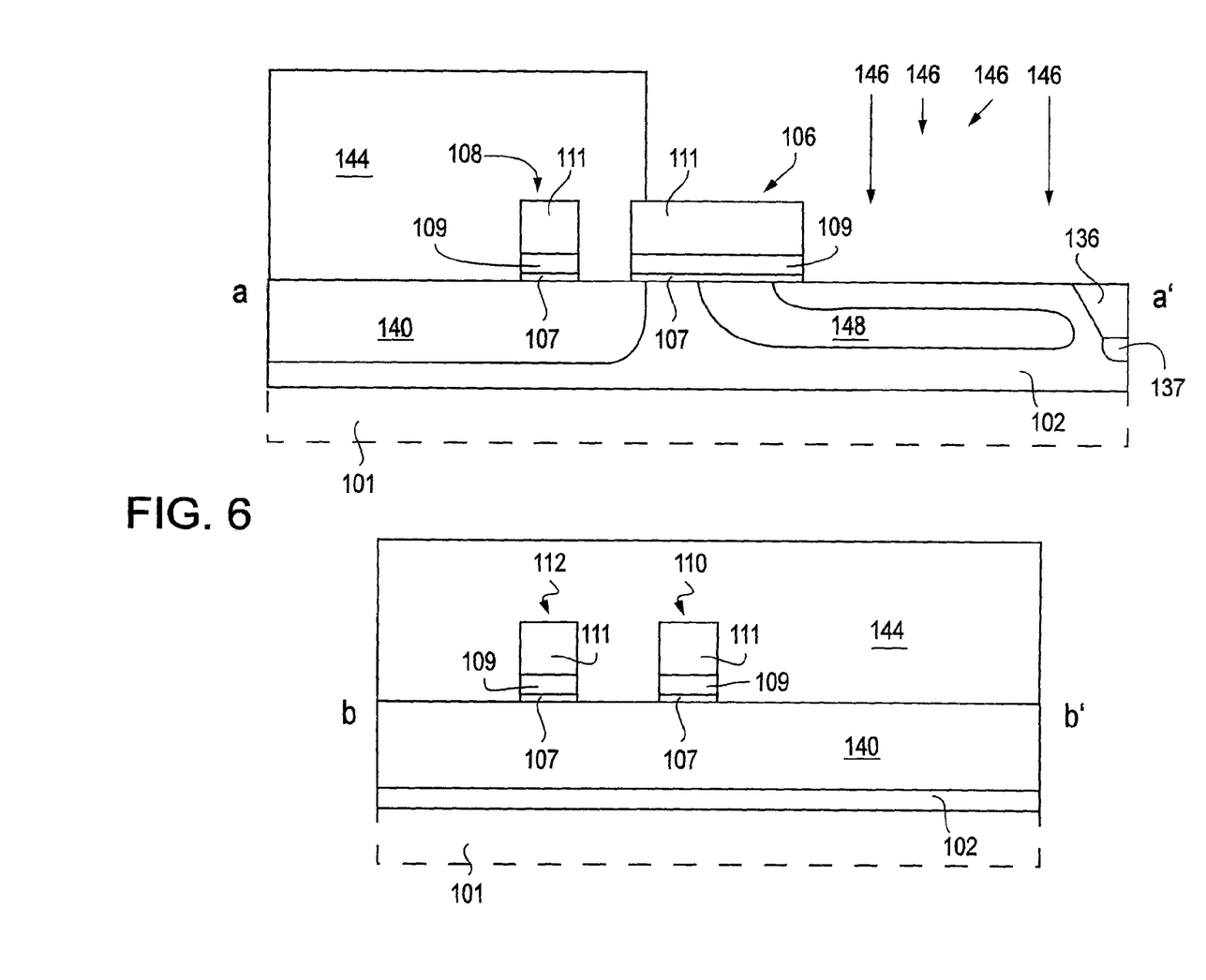
Figure 7:
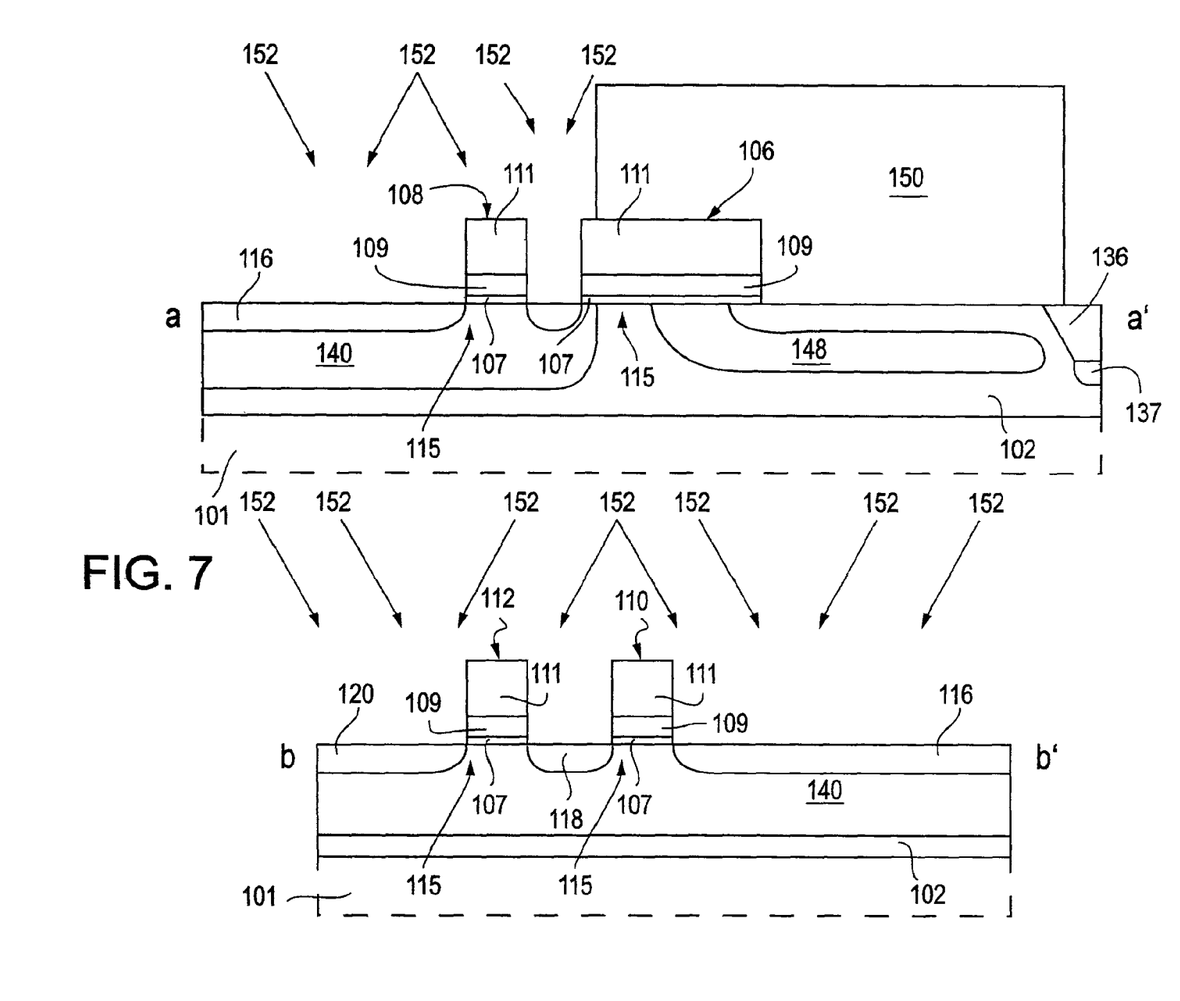

Now referring to FIG. 7, this figure shows the wafer cross-section shown in FIG. 6 at a subsequent stage of fabrication. After removing photoresist 144 (FIG. 6), another photoresist mask 150 is formed to protect the photodiode 104 region of the substrate 102 and expose the p-well region 140. An n-type dopant 152, e.g., phosphorus or arsenic, is implanted into the substrate 102 to form active areas proximate the gates 106, 108, 110, and 112, including the floating diffusion region 114 and source/drain regions 116, 118, and 120. The dopant implant 152 may also be angled with respect to the substrate 102 so the doped regions extend under the gates. Under the gates (106, 108, 110, and 112) and between the source/drain regions (116, 118, and 120) and photodiode (104) are the channel regions 115.

Figure 8:
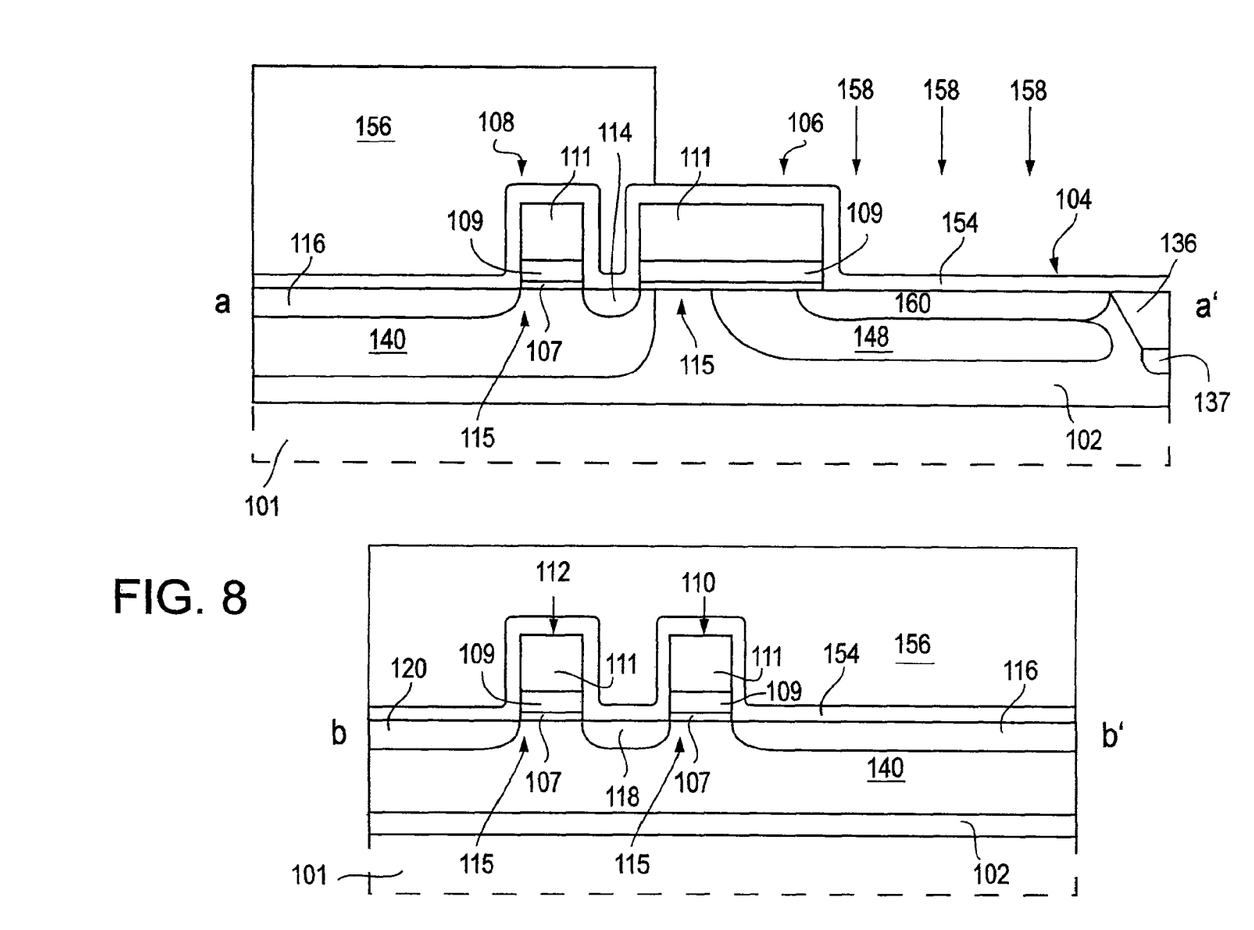

Now referring to FIG. 8, this figure shows the wafer cross-section shown in FIG. 7 at a subsequent stage of fabrication. The photoresist 150 (FIG. 7) is removed and an insulating spacer layer 154 is formed over the substrate 102 and gates 106, 108, 110, and 112. The insulating spacer layer 154 can be formed of TEOS or other similar dielectric materials. Over the insulating spacer layer 152 and the p-well 140 another photoresist mask 156 is formed; the photodiode 104 (FIG. 2) region of the substrate 102 is exposed. A p-type dopant 158, e.g., boron, is implanted into the substrate 102 to form a p-type region 160 at the substrate 102 surface above the n-type region 148 of the photodiode 104. This creates a p-n junction for photo-charge generation.

Figure 9:
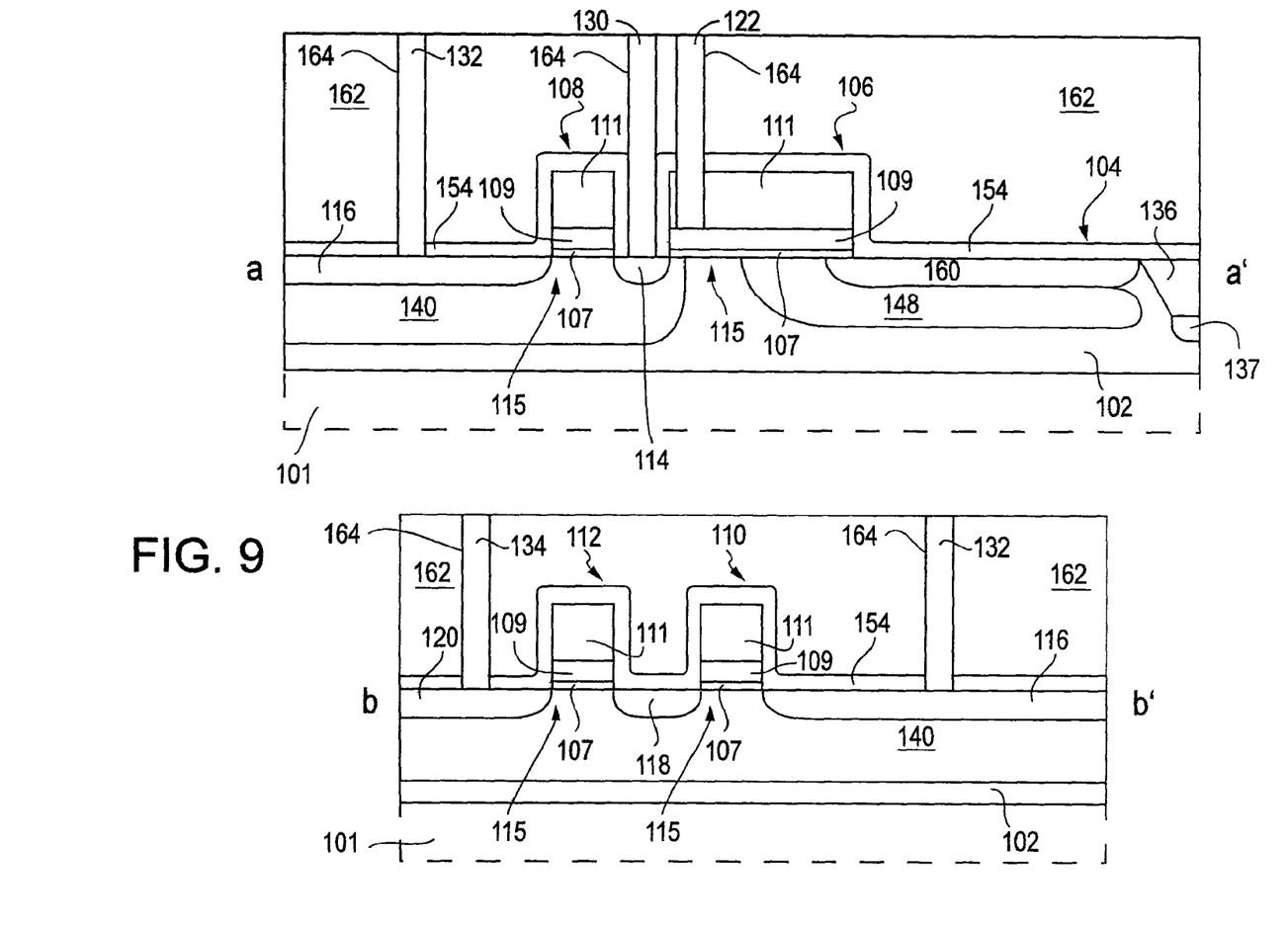

FIG. 9 shows the wafer cross-sections shown in FIG. 8 at a subsequent stage of fabrication. After completing the photodiode 104, the photoresist 156 (FIG. 8) is removed. A thick insulating layer 162 is formed over the substrate 102, including the photodiode 104 and gates 106, 108, 110, and 112. This layer 162 should be transparent to light since it will cover the photodiode 104; it can be BPSG (boro-phospho-silicate glass) or another suitable material. The insulating layer 162 is planarized, preferably by CMP (chemical mechanical polishing) and patterned for etching, e.g., with photoresist (not shown).

Still referring to FIG. 9, vias 164 are formed through the insulating layer 162 and other intervening layers (e.g., spacer layer 154, insulating layer 111, etc.) by controlled etching (preferably by RIE dry etching as is known in the art) to expose the conductive layer 109 of the gates 106, 108, 110, and 112 and to expose the substrate 102 surface at the floating diffusion region 114 and source/drain regions 116, 118, and 120. The vias 164 are filled with a conductive material to form contacts 122, 124, 126, 128, 130, 132, and 134 (not all contacts shown in FIG. 2 are necessarily in the cross-sections shown in FIG. 9), preferably by a sputtering or chemical vapor deposition (CVD) technique, although other techniques can be used. The conductive material is preferably tungsten or titanium, which can be annealed to form a silicide. The conductive material is next planarized by CMP, using the insulating layer 162 as a stop to leave a wafer cross-section as shown in FIG. 9. This may be followed by standard metallization layer and interconnect line formation (not shown).

Figure 10:
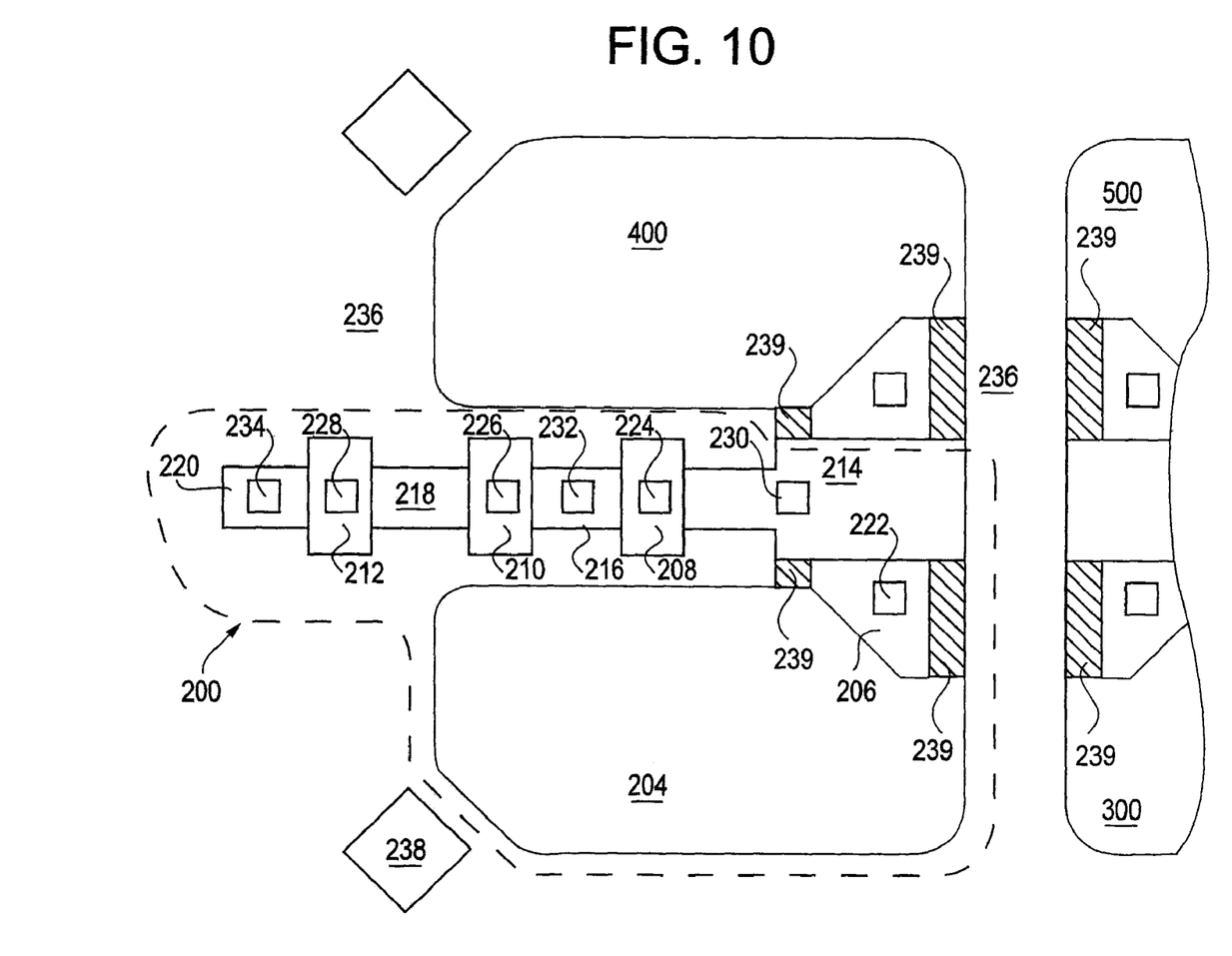
FIG. 10 shows an exemplary imager lay-out utilizing pixels in accordance with the invention.

An alternative embodiment of the invention is shown in FIG. 10. While the same basic fabrication steps and techniques discussed above in relation to FIGS. 2-9 can be used to form the pixel 200 (defined by dotted-line) shown in FIG. 10, the features and elements of the pixel 200 are configured differently with respect to each other when compared to the layout of the pixel 100 of FIG. 2. FIG. 10 shows the pixel 200 configuration in an array of like pixels.

In FIG. 10, pixel 200 shares part of its circuitry components, i.e., gates 208, 210, 212, with other adjacent pixels, e.g., 300, 400, and 500, which are part of an array of similarly arranged pixels. Each pixel 200, 300, and 400 has an individual photodiode; e.g., photodiode 204 of pixel 200. The sharing of circuitry makes for a much more dense imager array. In this embodiment, the transfer gate 206 is again configured so as not to overlap STI regions 236. As shown in FIG. 10, optionally, implant regions 239 of p-type ions can be provided between the STI regions 236 and the transfer gate 206.

Preferably, the transfer gate 206 is angled with respect to the photodiode 204, as shown in FIG. 10. Here, the term "angled" means that a portion of the transfer gate 206 is positioned across a corner of the photodiode 204 as opposed to across its length or width, as discussed above in relation to the embodiment shown in FIG. 2. This preferred angled geometry of the transfer gate 206 allows for an efficient layout of the transfer gate 206. In addition, this angled layout is also beneficial in maximizing the fill factor of the pixel 200 by maximizing the area of the photodiode 204.

The remaining pixel components are shared by the adjacent pixels 200 and 400. These components include the floating diffusion region 214, which serves as a common storage node for the pixels 200 and 400. A reset gate 208 is located proximate the floating diffusion region 214. A source/drain region 216 is located on a second side of the reset gate 208 opposite the floating diffusion region 214 and is capable of receiving a supply voltage ($V_{aa}$). The floating diffusion region 214 is also electrically connected to the source follower gate 210 (connection not shown), which has a source/drain 218. The source follower transistor having gate 210 outputs a voltage output signal from the floating diffusion region 214 to the row select transistor having gate 212. The row select transistor gate 212 has a source/drain 220 adjacent thereto for selectively reading out the pixel signal to a column line (not shown). In addition, a capacitor 238 is electrically connected (not shown) to the floating diffusion region 214. The capacitor 238 can increase the charge storage capacity of the floating diffusion region 214. The transistor gates 206, 208, 210, and 212, floating diffusion region 214, and source/drain regions 216, 218, and 220, have contacts 222, 224, 226, 228, 230, 232, and 234, respectively thereto.

Figure 11:
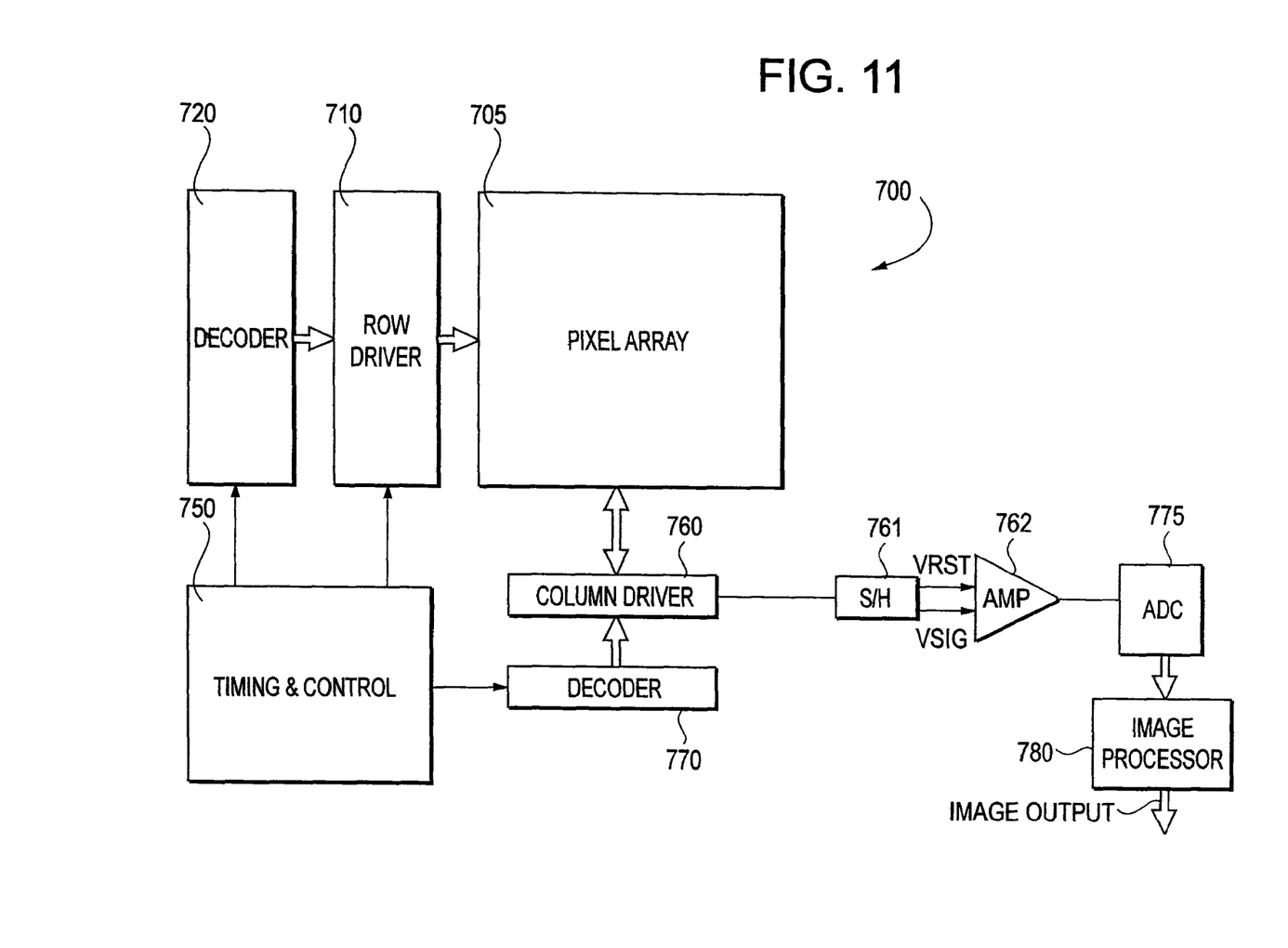
FIG. 11 shows a CMOS pixel cell in accordance with an embodiment of the invention.

FIG. 11 illustrates an exemplary imager 700 that may utilize any embodiment of the invention. The imager 700 has a pixel array 705 comprising pixels constructed as described above with respect to, e.g., FIGS. 2 and 10, or using other pixel architectures within the scope of the invention. Row lines are selectively activated by a row driver 710 in response to row address decoder 720. A column driver 760 and column address decoder 770 are also included in the imager 700. The imager 700 is operated by the timing and control circuit 750, which controls the address decoders 720, 770. The control circuit 750 also controls the row and column driver circuitry 710, 760 in accordance with an embodiment of the invention.

A sample and hold circuit 761 associated with the column driver 760 reads a pixel reset signal $V_{rst}$ and a pixel image signal $V_{sig}$ for selected pixels. A differential signal ($V_{rst}$-$V_{sig}$) is amplified by differential amplifier 762 for each pixel and is digitized by analog-to-digital converter 775 (ADC). The analog-to-digital converter 775 supplies the digitized pixel signals to an image processor 780 which forms a digital image. The image processor 780 may also determine the gain setting of the imager 700, which can be used to set the level of the voltage applied to the pixels transfer gates.

Figure 12:
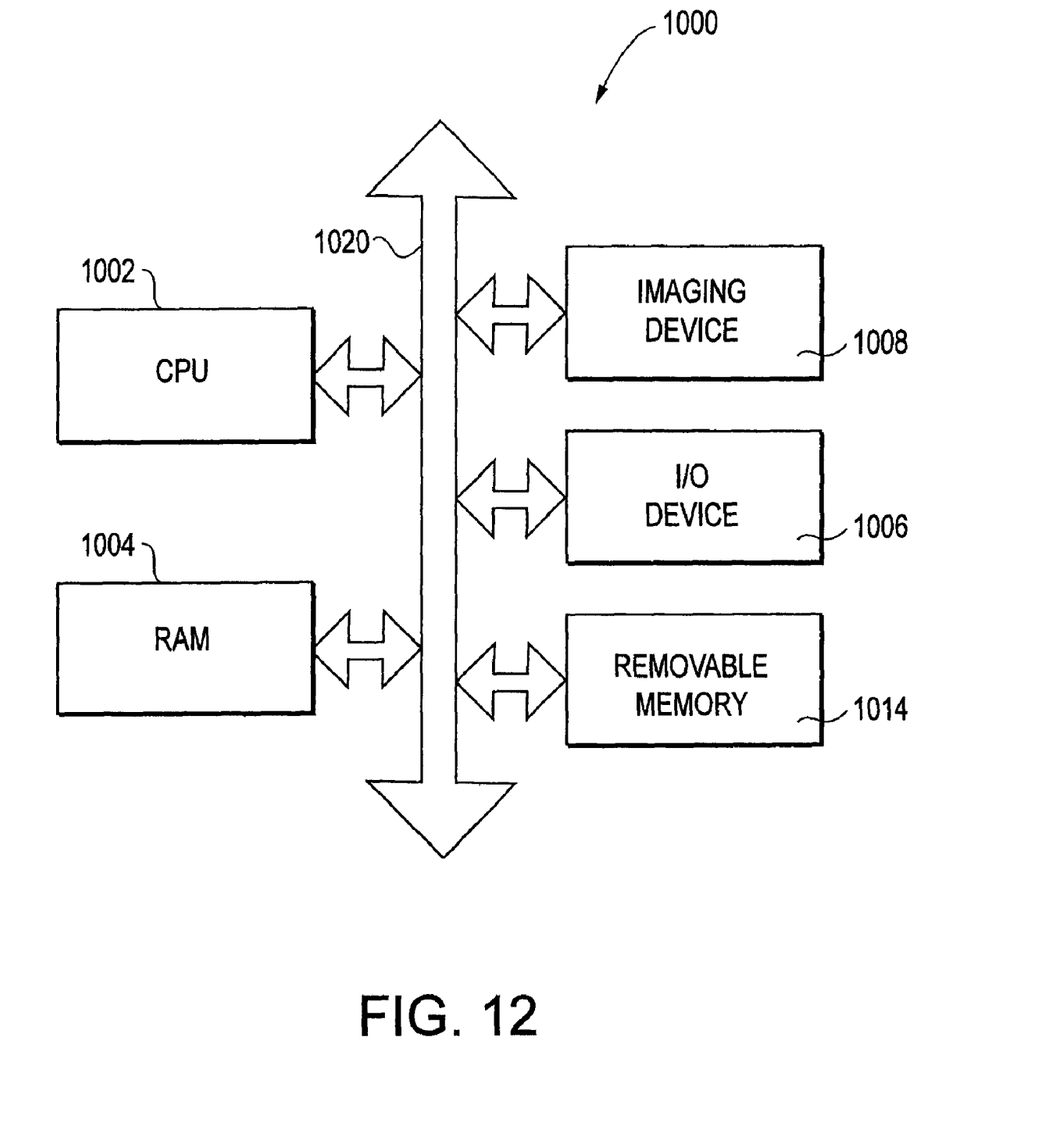
FIG. 12 shows a processor system incorporating at least one imager constructed in accordance with an embodiment of the invention.

FIG. 12 shows a system 1000, a typical processor system modified to include an imaging device 1008 (such as an imager 700 as shown in FIG. 11 with pixels 100 or 200 as illustrated in FIGS. 2 and 10) of the invention. The processor system 1000 is exemplary of a system having digital circuits that could include image sensor devices. Without being limiting, such a system could include a computer system, camera system, scanner, machine vision, vehicle navigation, video phone, surveillance system, auto focus system, star tracker system, motion detection system, image stabilization system, and data compression system, and other systems employing an imager.

System 1000, for example a camera system, generally comprises a central processing unit (CPU) 1002, such as a microprocessor, that communicates with an input/output (I/O) device 1006 over a bus 1020. Imaging device 1008 also communicates with the CPU 1002 over the bus 1020. The processor-based system 1000 also includes random access memory (RAM) 1004, and can include removable memory 1014, such as flash memory, which also communicate with the CPU 1002 over the bus 1020. The imaging device 1008 may be combined with a processor, such as a CPU, digital signal processor, or microprocessor, with or without memory storage on a single integrated circuit or on a different chip than the processor.

Various embodiments of the invention have been described above. Although this invention has been described with reference to these specific embodiments, the descriptions are intended to be illustrative of the invention and are not intended to be limiting. Various modifications and applications may occur to those skilled in the art without departing from the spirit and scope of the invention as defined in the appended claims.

What is claimed as new and sought to be protected by letters patent is as follows:

1. An imager pixel, comprising:
   a substrate;
   a photoconversion device comprising an active area in the substrate; and
   a circuit configured to receive charge from the photoconversion device and output a signal representative of the charge, the circuit comprising a transfer transistor gate located over the substrate and entirely within the boundaries of the active area of the photoconversion device.

2. The imager pixel of claim 1, further comprising an oxide region surrounding the active area.

3. The imager pixel of claim 2, wherein said oxide region comprises a shallow trench isolation region.

4. The imager pixel of claim 2, further comprising at least one implant region in the active area of the photoconversion device between an edge of the transfer transistor gate and an edge of the oxide region.

5. The imager pixel of claim 4, wherein the at least one implant region comprises a p-type dopant.

6. The imager pixel of claim 1, wherein the circuit further comprises a reset transistor, a source follower transistor, and a row select transistor.

7. The imager pixel of claim 1, wherein at least a part of the circuit is shared with an adjacent pixel.

8. The imager pixel of claim 1, wherein an edge of the transfer transistor gate is angled across a corner of the photoconversion device.

9. A CMOS imager device, comprising:
   an active area in a substrate;
   a photodiode in the active area;
   a charge storage region in the active area;
   a transfer gate located entirely within the boundaries of the active area, the transfer gate being configured to gate charge between the photodiode and the charge storage region;
   a reset gate configured to reset the charge storage region;
   a source follower gate configured to receive charge from the charge storage region;
   a row select gate configured to couple the source follower gate to an output line; and
   at least one implant region in the substrate adjacent an edge of the transfer gate.

10. The CMOS imager device of claim 9, further comprising an oxide region surrounding the active area.

11. The CMOS imager device of claim 10, wherein the at least one implant region is located between an edge of the transfer transistor and an edge of the oxide region.

12. The CMOS imager device of claim 9, wherein at least one of the reset gate, source follower gate, row select gate, and charge storage region is shared with an adjacent pixel.

13. The CMOS imager device of claim 9, wherein an edge of the transfer gate is angled across a corner of the photodiode.

14. A method of forming an imager pixel, comprising:
   providing an active area in a substrate;
   forming a photoconversion device in the active area;
   forming a transfer transistor gate entirely within the boundaries of the active area; and
   forming at least one implant region adjacent an edge of the transfer transistor gate.

15. The method of claim 14, wherein an edge of the transfer transistor gate is formed across a corner of the photoconversion device.

16. The method of claim 14, further comprising the step of forming an oxide region surrounding the active area.

17. The method of claim 16, wherein the at least one implant region is formed between an edge of the transfer transistor and an edge of the oxide region.

18. The method of claim 14, wherein the step of forming an oxide region comprises forming a shallow trench isolation region.

19. The method of claim 14, further comprising the step of forming a reset transistor, a source follower transistor, and a row select transistor proximate the photoconversion device.

20. The method of claim 19, further comprising the step of forming a second photoconversion device that shares at least one of the reset transistor, source follower transistor, and row select transistor.

* * * * *